US008150065B2

(12) United States Patent
Solbach et al.

(10) Patent No.: US 8,150,065 B2
(45) Date of Patent: Apr. 3, 2012

(54) SYSTEM AND METHOD FOR PROCESSING AN AUDIO SIGNAL

(75) Inventors: Ludger Solbach, Mountain View, CA (US); Lloyd Watts, Mountain View, CA (US)

(73) Assignee: Audience, Inc., Mountain View, CA (US)

( * ) Notice: Subject to any disclaimer, the term of this patent is extended or adjusted under 35 U.S.C. 154(b) by 873 days.

(21) Appl. No.: 11/441,675

(22) Filed: May 25, 2006

(65) Prior Publication Data

US 2007/0276656 A1 Nov. 29, 2007

(51) Int. Cl.
*H03G 5/00* (2006.01)

(52) U.S. Cl. ........................................................ 381/98

(58) Field of Classification Search .................... 381/99, 381/98, 97, 103, 94.2, 94.3; 333/132, 175, 333/176; 704/200.1
See application file for complete search history.

(56) References Cited

U.S. PATENT DOCUMENTS

| | | | | |
|---|---|---|---|---|
| 3,976,863 | A | 8/1976 | Engel | |
| 3,978,287 | A | 8/1976 | Fletcher et al. | |
| 4,137,510 | A * | 1/1979 | Iwahara | 333/132 |
| 4,433,604 | A | 2/1984 | Ott | |
| 4,516,259 | A | 5/1985 | Yato et al. | |
| 4,536,844 | A | 8/1985 | Lyon | |
| 4,581,758 | A | 4/1986 | Coker et al. | |
| 4,628,529 | A | 12/1986 | Borth et al. | |
| 4,630,304 | A | 12/1986 | Borth et al. | |
| 4,649,505 | A | 3/1987 | Zinser, Jr. et al. | |
| 4,658,426 | A | 4/1987 | Chabries et al. | |
| 4,674,125 | A | 6/1987 | Carlson et al. | |
| 4,718,104 | A | 1/1988 | Anderson | |
| 4,811,404 | A | 3/1989 | Vilmur et al. | |
| 4,812,996 | A | 3/1989 | Stubbs | |
| 4,864,620 | A | 9/1989 | Bialick | |
| 4,920,508 | A | 4/1990 | Yassaie et al. | |
| 5,027,410 | A | 6/1991 | Williamson et al. | |
| 5,054,085 | A | 10/1991 | Meisel et al. | |
| 5,058,419 | A | 10/1991 | Nordstrom et al. | |
| 5,099,738 | A | 3/1992 | Hotz | |
| 5,119,711 | A | 6/1992 | Bell et al. | |
| 5,142,961 | A | 9/1992 | Paroutand | |
| 5,150,413 | A | 9/1992 | Nakatani et al. | |
| 5,175,769 | A | 12/1992 | Hejna, Jr. et al. | |

(Continued)

FOREIGN PATENT DOCUMENTS

JP 62110349 5/1987

(Continued)

OTHER PUBLICATIONS

Rabiner, Lawrence R., and Ronald W. Schafer. Digital Processing of Speech Signals (Prentice-Hall Series in Signal Processing). Upper Saddle River, NJ: Prentice Hall, 1978.*

(Continued)

*Primary Examiner* — Vivian Chin
*Assistant Examiner* — Kile Blair
(74) *Attorney, Agent, or Firm* — Carr & Ferrell LLP

(57) ABSTRACT

Systems and methods for audio signal processing are provided. In exemplary embodiments, a filter cascade of complex-valued filters are used to decompose an input audio signal into a plurality of frequency components or sub-band signals. These sub-band signals may be processed for phase alignment, amplitude compensation, and time delay prior to summation of real portions of the sub-band signals to generate a reconstructed audio signal.

23 Claims, 8 Drawing Sheets

U.S. PATENT DOCUMENTS 5,187,776 A 2/1993 Yanker
5,208,864 A 5/1993 Kaneda
5,210,366 A 5/1993 Sykes, Jr.
5,230,022 A * 7/1993 Sakata ........................... 381/98
5,319,736 A 6/1994 Hunt
5,323,459 A 6/1994 Hirano
5,341,432 A 8/1994 Suzuki et al.
5,381,473 A 1/1995 Andrea et al.
5,381,512 A 1/1995 Holton et al.
5,400,409 A 3/1995 Linhard
5,402,493 A 3/1995 Goldstein
5,402,496 A 3/1995 Soli et al.
5,471,195 A 11/1995 Rickman
5,473,702 A 12/1995 Yoshida et al.
5,473,759 A 12/1995 Slaney et al.
5,479,564 A 12/1995 Vogten et al.
5,502,663 A 3/1996 Lyon
5,544,250 A 8/1996 Urbanski
5,574,824 A 11/1996 Slyh et al.
5,583,784 A 12/1996 Kapust et al.
5,587,998 A 12/1996 Velardo, Jr. et al.
5,590,241 A 12/1996 Park et al.
5,602,962 A 2/1997 Kellermann
5,675,778 A 10/1997 Jones
5,682,463 A 10/1997 Allen et al.
5,694,474 A 12/1997 Ngo et al.
5,706,395 A 1/1998 Arslan et al.
5,717,829 A 2/1998 Takagi
5,729,612 A 3/1998 Abel et al.
5,732,189 A 3/1998 Johnston et al.
5,749,064 A 5/1998 Pawate et al.
5,757,937 A 5/1998 Itoh et al.
5,792,971 A 8/1998 Timis et al.
5,796,819 A 8/1998 Romesburg
5,806,025 A 9/1998 Vis et al.
5,809,463 A 9/1998 Gupta et al.
5,825,320 A 10/1998 Miyamori et al.
5,839,101 A 11/1998 Vähätalo et al.
5,920,840 A 7/1999 Satyamurti et al.
5,933,495 A 8/1999 Oh
5,943,429 A 8/1999 Händel
5,956,674 A 9/1999 Smyth et al.
5,974,380 A 10/1999 Smyth et al.
5,978,824 A 11/1999 Ikeda
5,983,139 A 11/1999 Zierhofer
5,990,405 A 11/1999 Auten et al.
6,002,776 A 12/1999 Bhadkamkar et al.
6,061,456 A 5/2000 Andrea et al.
6,072,881 A 6/2000 Linder
6,097,820 A 8/2000 Turner
6,108,626 A 8/2000 Cellario et al.
6,122,610 A 9/2000 Isabelle
6,134,524 A 10/2000 Peters et al.
6,137,349 A 10/2000 Menkhoff et al.
6,140,809 A 10/2000 Doi
6,173,255 B1 1/2001 Wilson et al.
6,180,273 B1 1/2001 Okamoto
6,216,103 B1 4/2001 Wu et al.
6,222,927 B1 4/2001 Feng et al.
6,223,090 B1 4/2001 Brungart
6,226,616 B1 5/2001 You et al.
6,263,307 B1 7/2001 Arslan et al.
6,266,633 B1 7/2001 Higgins et al.
6,317,501 B1 11/2001 Matsuo
6,339,758 B1 1/2002 Kanazawa et al.
6,355,869 B1 3/2002 Mitton
6,363,345 B1 3/2002 Marash et al.
6,381,570 B2 4/2002 Li et al.
6,430,295 B1 8/2002 Handel et al.
6,434,417 B1 8/2002 Lovett
6,449,586 B1 9/2002 Hoshuyama
6,469,732 B1 10/2002 Chang et al.
6,487,257 B1 11/2002 Gustafsson et al.
6,496,795 B1 * 12/2002 Malvar .......................... 704/203
6,513,004 B1 1/2003 Rigazio et al.
6,516,066 B2 2/2003 Hayashi
6,529,606 B1 3/2003 Jackson, Jr. II et al.
6,549,630 B1 4/2003 Bobisuthi
6,584,203 B2 6/2003 Elko et al.
6,622,030 B1 9/2003 Romesburg et al.
6,717,991 B1 4/2004 Gustafsson et al.
6,718,309 B1 4/2004 Selly
6,738,482 B1 5/2004 Jaber
6,760,450 B2 7/2004 Matsuo
6,785,381 B2 8/2004 Gartner et al.
6,792,118 B2 9/2004 Watts
6,795,558 B2 9/2004 Matsuo
6,798,886 B1 9/2004 Smith et al.
6,810,273 B1 10/2004 Mattila et al.
6,882,736 B2 4/2005 Dickel et al.
6,915,264 B2 7/2005 Baumgarte
6,917,688 B2 7/2005 Yu et al.
6,944,510 B1 9/2005 Ballesty et al.
6,978,159 B2 12/2005 Feng et al.
6,982,377 B2 1/2006 Sakurai et al.
6,999,582 B1 2/2006 Popovic et al.
7,016,507 B1 3/2006 Brennan
7,020,605 B2 3/2006 Gao
7,031,478 B2 4/2006 Belt et al.
7,054,452 B2 5/2006 Ukita
7,065,485 B1 6/2006 Chong-White et al.
7,076,315 B1 7/2006 Watts
7,092,529 B2 8/2006 Yu et al.
7,092,882 B2 8/2006 Arrowood et al.
7,099,821 B2 8/2006 Visser et al.
7,142,677 B2 11/2006 Gonopolskiy et al.
7,146,316 B2 12/2006 Alves
7,155,019 B2 12/2006 Hou
7,164,620 B2 1/2007 Hoshuyama
7,171,008 B2 1/2007 Elko
7,171,246 B2 1/2007 Mattila et al.
7,174,022 B1 2/2007 Zhang et al.
7,206,418 B2 4/2007 Yang et al.
7,209,567 B1 4/2007 Kozel et al.
7,225,001 B1 5/2007 Eriksson et al.
7,242,762 B2 7/2007 He et al.
7,246,058 B2 7/2007 Burnett
7,254,242 B2 * 8/2007 Ise et al. ....................... 381/94.3
7,359,520 B2 4/2008 Brennan et al.
7,412,379 B2 8/2008 Taori et al.
2001/0016020 A1 8/2001 Gustafsson et al.
2001/0031053 A1 10/2001 Feng et al.
2002/0002455 A1 1/2002 Accardi et al.
2002/0009203 A1 1/2002 Erten
2002/0041693 A1 4/2002 Matsuo
2002/0080980 A1 6/2002 Matsuo
2002/0106092 A1 8/2002 Matsuo
2002/0116187 A1 8/2002 Erten
2002/0133334 A1 9/2002 Coorman et al.
2002/0147595 A1 10/2002 Baumgarte
2002/0184013 A1 12/2002 Walker
2003/0014248 A1 1/2003 Vetter
2003/0026437 A1 2/2003 Janse et al.
2003/0033140 A1 2/2003 Taori et al.
2003/0039369 A1 2/2003 Bullen
2003/0040908 A1 2/2003 Yang et al.
2003/0061032 A1 3/2003 Gonopolskiy
2003/0063759 A1 4/2003 Brennan et al.
2003/0072382 A1 4/2003 Raleigh et al.
2003/0072460 A1 4/2003 Gonopolskiy et al.
2003/0095667 A1 5/2003 Watts
2003/0099345 A1 5/2003 Gartner et al.
2003/0101048 A1 5/2003 Liu
2003/0103632 A1 6/2003 Goubran et al.
2003/0128851 A1 7/2003 Furuta
2003/0138116 A1 7/2003 Jones et al.
2003/0147538 A1 8/2003 Elko
2003/0169891 A1 9/2003 Ryan et al.
2003/0228023 A1 12/2003 Burnett et al.
2004/0013276 A1 1/2004 Ellis et al.
2004/0047464 A1 3/2004 Yu et al.
2004/0057574 A1 3/2004 Faller
2004/0078199 A1 4/2004 Kremer et al.
2004/0131178 A1 7/2004 Shahaf et al.
2004/0133421 A1 7/2004 Burnett et al.
2004/0165736 A1 8/2004 Hetherington et al.
2004/0196989 A1 10/2004 Friedman et al.

| | | | |
|---|---|---|---|
| 2004/0263636 | A1 | 12/2004 | Cutler et al. |
| 2005/0025263 | A1 | 2/2005 | Wu |
| 2005/0027520 | A1 | 2/2005 | Mattila et al. |
| 2005/0049864 | A1 | 3/2005 | Kaltenmeier et al. |
| 2005/0060142 | A1 | 3/2005 | Visser et al. |
| 2005/0152559 | A1 | 7/2005 | Gierl et al. |
| 2005/0185813 | A1 | 8/2005 | Sinclair et al. |
| 2005/0213778 | A1 | 9/2005 | Buck et al. |
| 2005/0216259 | A1 | 9/2005 | Watts |
| 2005/0228518 | A1 | 10/2005 | Watts |
| 2005/0276423 | A1 | 12/2005 | Aubauer et al. |
| 2005/0288923 | A1 | 12/2005 | Kok |
| 2006/0072768 | A1 | 4/2006 | Schwartz et al. |
| 2006/0074646 | A1 | 4/2006 | Alves et al. |
| 2006/0098809 | A1 | 5/2006 | Nongpiur et al. |
| 2006/0120537 | A1 | 6/2006 | Burnett et al. |
| 2006/0133621 | A1 | 6/2006 | Chen et al. |
| 2006/0149535 | A1 | 7/2006 | Choi et al. |
| 2006/0184363 | A1 | 8/2006 | McCree et al. |
| 2006/0198542 | A1 | 9/2006 | Benjelloun Touimi et al. |
| 2006/0222184 | A1 | 10/2006 | Buck et al. |
| 2007/0021958 | A1 | 1/2007 | Visser et al. |
| 2007/0027685 | A1 | 2/2007 | Arakawa et al. |
| 2007/0033020 | A1 | 2/2007 | (Kelleher) Francois et al. |
| 2007/0067166 | A1 | 3/2007 | Pan et al. |
| 2007/0078649 | A1 | 4/2007 | Hetherington et al. |
| 2007/0094031 | A1 | 4/2007 | Chen |
| 2007/0100612 | A1 | 5/2007 | Ekstrand et al. |
| 2007/0116300 | A1 | 5/2007 | Chen |
| 2007/0150268 | A1 | 6/2007 | Acero et al. |
| 2007/0154031 | A1 | 7/2007 | Avendano et al. |
| 2007/0165879 | A1 | 7/2007 | Deng et al. |
| 2007/0195968 | A1 | 8/2007 | Jaber |
| 2007/0230712 | A1 | 10/2007 | Belt et al. |
| 2008/0019548 | A1 | 1/2008 | Avendano |
| 2008/0033723 | A1 | 2/2008 | Jang et al. |
| 2008/0140391 | A1 | 6/2008 | Yen et al. |
| 2008/0201138 | A1 | 8/2008 | Visser et al. |
| 2008/0228478 | A1 | 9/2008 | Hetherington et al. |
| 2008/0260175 | A1 | 10/2008 | Elko |
| 2009/0012783 | A1 | 1/2009 | Klein |
| 2009/0012786 | A1 | 1/2009 | Zhang et al. |
| 2009/0129610 | A1 | 5/2009 | Kim et al. |
| 2009/0220107 | A1 | 9/2009 | Every et al. |
| 2009/0238373 | A1 | 9/2009 | Klein |
| 2009/0253418 | A1 | 10/2009 | Makinen |
| 2009/0271187 | A1 | 10/2009 | Yen et al. |
| 2009/0323982 | A1 | 12/2009 | Solbach et al. |
| 2010/0094643 | A1 | 4/2010 | Avendano et al. |
| 2010/0278352 | A1 | 11/2010 | Petit et al. |
| 2011/0178800 | A1 | 7/2011 | Watts |

FOREIGN PATENT DOCUMENTS

| | | |
|---|---|---|
| JP | 4184400 | 7/1992 |
| JP | 05053587 | 3/1993 |
| JP | 6269083 | 9/1994 |
| JP | 10-313497 | 11/1998 |
| JP | 11-249693 | 9/1999 |
| JP | 2005110127 | 4/2005 |
| JP | 2005195955 | 7/2005 |
| WO | 01/74118 | 10/2001 |
| WO | 03/043374 | 5/2003 |
| WO | WO 03069499 A1 * | 8/2003 |
| WO | 2007/081916 | 7/2007 |
| WO | 2007/140003 | 12/2007 |
| WO | 2010/005493 | 1/2010 |

OTHER PUBLICATIONS

Martin R. "Spectral subtraction based on minimum statistics," in Proc. Eur. Signal Processing Conf., 1994, pp. 1182-1185.*

"ENT 172." Instructional Module. Prince George's Community College Department of Engineering Technology. Accessed: Oct. 15, 2011. Subsection: "Polar and Rectangular Notation". <http://academic.pgcc.edu/ent/ent172_instr_mod.html>.*

Haykin, Simon; Van Veen, Barry. "Appendix A.2 Complex Numbers." Signals and Systems. 2nd ed. 2003. p. 764.*

Mitra, Sanjit K. Digital Signal Processing: a Computer-based Approach. 2nd ed. 2001. pp. 131-133.*

Hyuk Jeong et al., "Implementation of a New Algorithm Using the STFT with Variable Frequency Resolution for the Time-Frequency Auditory Model", J. Audio Eng. Soc., Apr. 1999, vol. 47, No. 4., pp. 240-251.

James M. Kates, "A Time Domain Digital Cochlear Model", IEEE Transactions on Signal Proccessing, Dec. 1991, vol. 39, No. 12, pp. 2573-2592.

Malcom Slaney, "Lyon's Cochlear Model", Advanced Technology Group, Apple Technical Report #13, 1988, Apple Computer, Inc.

"Cool Edit User's Manual", Syntrillium Software Corporation, 1992-1996.

Lloyd Watts, Ph. D., "Robust Hearing Systems for Intelligent Machines", Applied Neurosystems Corporation, 2001.

Richard P. Lippmann, "Speech Recognition by Machines and Humans", Speech Communication 22(1997) 1-15, 1997 Elseiver Science B.V.

Hynek Hermansky, "Should Recognizers Have Ears?", in Proc. ESCA Tutorial and Research Workshop on Robust Speech Recognition for Unknown Communication Channels, pp. 1-10, France 1997.

V. Hohmann, "Frequency Analysis and Synthesis Using a Gammatone Filterbank", ACTA Acustica United with Acustica, 2002, vol. 88, pp. 433-442.

Steven Schimmel et al., "Coherent Envelope Detection for Modulation Filtering of Speech", ICASSP 2005, pp. 1-221-1-224, 2005 IEEE.

Ludger Solbach, "An Architecture for Robust Partial Tracking and Onset Localization in Single Channel Audio Signal Mixes", Tuhn Technical University, Hamburg and Harburg, ti6 Verteilte Systeme, 1998.

Tchorz et al., "SNR Estimation Based on Amplitude Modulation Analysis with Applications to Noise Suppression", source(s): IEEE Transactions on Speech and Audio Processing, vol. 11, No. 3, May 2003, pp. 184-192.

Stahl et al., "Quantile Based Noise Estimation for Spectral Subtraction and Wiener Filtering", source(s): IEEE, 2000, pp. 1875-1878.

Yoo et al., "Continuous-Time Audio Noise Suppression and Real-Time Implementation", source(s): IEEE, 2002, pp. IV3980-IV3983.

Steven Boll, "Suppression of Acoustic Noise in Speech using Spectral Subtraction", source(s): IEEE Transactions on Acoustics, Speech and Signal Processing, vol. ASSP-27, No. 2, Apr. 1979, pp. 113-120.

Dahl et al., "Simultaneous Echo Cancellation and Car Noise Suppression Employing a Microphone Array", source(s): IEEE, 1997, pp. 239-382.

Graupe et al., "Blind Adaptive Filtering of Speech from Noise of Unknown Spectrum Using Virtual Feedback Configuration", source(s): IEEE, 2000, pp. 146-158.

Fulghum et al., "LPC Voice Digitizer with Background Noise Suppression", source(s): IEEE, 1979, pp. 220-223.

Malcom Slaney, "Lyon's Cochlear Model", 1988, Apple Technical Report #13, AppleComputer, Inc.

Slaney, Malcom, Naar, Daniel, Lyon, Richard F. (1994). "Auditory model inversion for sound separation," Proc. of IEEE Intl. Conf. on Acous., Speech and Sig. Proc., Sydney, vol. II, 77-80.

Slaney, Malcom. "An Introduction to Auditory Model Inversion," Interval Technical Report IRC1994-014, http://cobweb.ecn.purdue.edu/~malcolm/interval/1994-014/, Sep. 1994.

P. Cosi and E. Zovato (1996), "Lyon's Auditory Model Inversion: a Tool for Sound Separation and Speech Enhancement", Proceedings of ESCA Workshop on 'The Auditory Basis of Speech Perceprion', Keele University, Keele (UK), Jul. 15-19, 1996, pp. 194-197.

Allen, Jont B. "Short Term Spectral Analysis, Synthesis, and Modification by Discrete Fourier Transform", IEEE Transactions on Acoustics, Speech, and Signal Processing. vol. ASSP-25, No. 3, Jun. 1977. pp. 235-238.

Allen, Jont B. et al. "A Unified Approach to Short-Time Fourier Analysis and Synthesis", Proceedings of the IEEE. vol. 65, No. 11, Nov. 1977. pp. 1558-1564.

Avendano, Carlos, "Frequency-Domain Source Identification and Manipulation in Stereo Mixes for Enhancement, Suppression and Re-Panning Applications," 2003 IEEE Workshop on Application of Signal Processing to Audio and Acoustics, Oct. 19-22, pp. 55-58, New Paltz, New York, USA.

Boll, Steven F. et al. "Suppression of Acoustic Noise in Speech Using Two Microphone Adaptive Noise Cancellation", IEEE Transactions on Acoustic, Speech, and Signal Processing, vol. ASSP-28, No. 6, Dec. 1980, pp. 752-753.
Boll, Steven F. "Suppression of Acoustic Noise in Speech Using Spectral Subtraction", Dept. of Computer Science, University of Utah Salt Lake City, Utah, Apr. 1979, pp. 18-19.
Chen, Jingdong et al. "New Insights into the Noise Reduction Wiener Filter", IEEE Transactions on Audio, Speech, and Language Processing. vol. 14, No. 4, Jul. 2006, pp. 1218-1234.
Cohen, Israel et al. "Microphone Array Post-Filtering for Non-Stationary Noise Suppression", IEEE International Conference on Acoustics, Speech, and Signal Processing, May 2002, pp. 1-4.
Cohen, Israel, "Multichannel Post-Filtering in Nonstationary Noise Environments", IEEE Transactions on Signal Processing, vol. 52, No. 5, May 2004, pp. 1149-1160.
Elko, Gary W., "Chapter 2: Differential Microphone Arrays", "Audio Signal Processing for Next-Generation Multimedia Communication Systems", 2004, pp. 12-65, Kluwer Academic Publishers, Norwell, Massachusetts, USA.
Fuchs, Martin et al. "Noise Suppression for Automotive Applications Based on Directional Information", 2004 IEEE International Conference on Acoustics, Speech, and Signal Processing, May 17-21, pp. 237-240.
Goubran, R.A. "Acoustic Noise Suppression Using Regression Adaptive Filtering", 1990 IEEE 40th Vehicular Technology Conference, May 6-9, pp. 48-53.
Jeffress, Lloyd A. et al. "A Place Theory of Sound Localization," Journal of Comparative and Physiological Psychology, 1948, vol. 41, p. 35-39.
Lazzaro, John et al., "A Silicon Model of Auditory Localization," Neural Computation Spring 1989, vol. 1, pp. 47-57, Massachusetts Institute of Technology.
Liu, Chen et al. "A Two-Microphone Dual Delay-Line Approach for Extraction of a Speech Sound in the Presence of Multiple Interferers", Journal of the Acoustical Society of America, vol. 110, No. 6, Dec. 2001, pp. 3218-3231.
Martin, Rainer et al. "Combined Acoustic Echo Cancellation, Dereverberation and Noise Reduction: A two Microphone Approach", Annales des Telecommunications/Annals of Telecommunications. vol. 49, No. 7-8, Jul.-Aug. 1994, pp. 429-438.
Mizumachi, Mitsunori et al. "Noise Reduction by Paired-Microphones Using Spectral Subtraction", 1998 IEEE International Conference on Acoustics, Speech and Signal Processing, May 12-15. pp. 1001-1004.
Moonen, Marc et al. "Multi-Microphone Signal Enhancement Techniques for Noise Suppression and Dereverbration," http://www.esat.kuleuven.ac.be/sista/yearreport97//node37.html, accessed on Apr. 21, 1998.
Watts, Lloyd Narrative of Prior Disclosure of Audio Display on Feb. 15, 2000 and May 31, 2000.
Parra, Lucas et al. "Convolutive Blind Separation of Non-Stationary Sources", IEEE Transactions on Speech and Audio Processing. vol. 8, No. 3, May 2008, pp. 320-327.
Weiss, Ron et al., "Estimating Single-Channel Source Separation Masks: Revelance Vector Machine Classifiers vs. Pitch-Based Masking", Workshop on Statistical and Perceptual Audio Processing, 2006.
Tashev, Ivan et al. "Microphone Array for Headset with Spatial Noise Suppressor", http://research.microsoft.com/ users/ivantash/Documents/Tashev_MAforHeadset_HSCMA_05.pdf. (4 pages).
Valin, Jean-Marc et al. "Enhanced Robot Audition Based on Microphone Array Source Separation with Post-Filter", Proceedings of 2004 IEEE/RSJ International Conference on Intelligent Robots and Systems, Sep. 28-Oct. 2, 2004, Sendai, Japan. pp. 2123-2128.
Widrow, B. et al., "Adaptive Antenna Systems," Proceedings of the IEEE, vol. 55, No. 12, pp. 2143-2159, Dec. 1967.
International Search Report dated Jun. 8, 2001 in Application No. PCT/US01/08372.
International Search Report dated Apr. 3, 2003 in Application No. PCT/US02/36946.
International Search Report dated May 29, 2003 in Application No. PCT/US03/04124.
International Search Report and Written Opinion dated Oct. 19, 2007 in Application No. PCT/US07/00463.
International Search Report and Written Opinion dated Apr. 9, 2008 in Application No. PCT/US07/21654.
International Search Report and Written Opinion dated Sep. 16, 2008 in Application No. PCT/US07/12628.
International Search Report and Written Opinion dated Oct. 1, 2008 in Application No. PCT/US08/08249.
International Search Report and Written Opinion dated May 11, 2009 in Application No. PCT/US09/01667.
International Search Report and Written Opinion dated Aug. 27, 2009 in Application No. PCT/US09/03813.
International Search Report and Written Opinion dated May 20, 2010 in Application No. PCT/US09/06754.
Fast Cochlea Transform, US Trademark Reg. No. 2,875,755 (Aug. 17, 2004).
Dahl, Mattias et al., "Acoustic Echo and Noise Cancelling Using Microphone Arrays", International Symposium on Signal Processing and its Applications, ISSPA, Gold coast, Australia, Aug. 25-30, 1996, pp. 379-382.
Demol, M. et al. "Efficient Non-Uniform Time-Scaling of Speech With WSOLA for CALL Applications", Proceedings of InSTIL/ICALL2004—NLP and Speech Technologies in Advanced Language Learning Systems—Venice Jun. 17-19, 2004.
Laroche, Jean. "Time and Pitch Scale Modification of Audio Signals", in "Applications of Digital Signal Processing to Audio and Acoustics", The Kluwer International Series in Engineering and Computer Science, vol. 437, pp. 279-309, 2002.
Moulines, Eric et al., "Non-Parametric Techniques for Pitch-Scale and Time-Scale Modification of Speech", Speech Communication, vol. 16, pp. 175-205, 1995.
Verhelst, Werner, "Overlap-Add Methods for Time-Scaling of Speech", Speech Communication vol. 30, pp. 207-221, 2000.

* cited by examiner

SYSTEM AND METHOD FOR PROCESSING AN AUDIO SIGNAL

CROSS-REFERENCE TO RELATED APPLICATIONS

The present application is related to U.S. patent application Ser. No. 10/613,224 entitled "Filter Set for Frequency Analysis" filed Jul. 3, 2003; U.S. patent application Ser. No. 10/613, 224 is a continuation of U.S. patent application Ser. No. 10/074,991, entitled "Filter Set for Frequency Analysis" filed Feb. 13, 2002, which is a continuation of U.S. patent application Ser. No. 09/534,682 entitled "Efficient Computation of Log-Frequency-Scale Digital Filter Cascade" filed Mar. 24, 2000; the disclosures of which are incorporated herein by reference.

BACKGROUND OF THE INVENTION

1. Field of the Invention

Embodiments of the present invention are related to audio processing, and more particularly to the analysis of audio signals.

2. Related Art

There are numerous solutions for splitting an audio signal into sub-bands and deriving frequency-dependent amplitude and phase characteristics varying over time. Examples include windowed fast Fourier transform/inverse fast Fourier transform (FFT/IFFT) systems as well as parallel banks of finite impulse response (FIR) and infinite impulse response (IIR) filter banks. These conventional solutions, however, all suffer from deficiencies.

Disadvantageously, windowed FFT systems only provide a single, fixed bandwidth for each frequency band. Typically, a bandwidth which is applied from low frequency to high frequency is chosen with a fine resolution at the bottom. For example, at 100 Hz, a filter (bank) with a 50 kHz bandwidth is desired. This means, however, that at 8 kHz, a 50 Hz bandwidth is used where a wider bandwidth such as 400 Hz may be more appropriate. Therefore, flexibility to match human perception cannot be provided by these systems.

Another disadvantage of windowed FFT systems is that inadequate fine frequency resolution of sparsely sampled windowed FFT systems at high frequencies can result in objectionable artifacts (e.g., "musical noise") if modifications are applied, (e.g., for noise suppression.) The number of artifacts can be reduced to some extent by dramatically reducing the number of samples of overlap between the windowed frames size "FFT hop size" (i.e., increasing oversampling.) Unfortunately, computational costs of FFT systems increase as oversampling increases. Similarly, the FIR subclass of filter banks are also computationally expensive due to the convolution of the sampled impulse responses in each sub-band which can result in high latency. For example, a system with a window of 256 samples will require 256 multiplies and a latency of 128 samples, if the window is symmetric.

The IIR subclass is computationally less expensive due to its recursive nature, but implementations employing only real-valued filter coefficients present difficulties in achieving near-perfect reconstruction, especially if the sub-band signals are modified. Further, phase and amplitude compensation as well as time-alignment for each sub-band is required in order to produce a flat frequency response at the output. The phase compensation is difficult to perform with real-valued signals, since they are missing the quadrature component for straightforward computation of amplitude and phase with fine time-resolution. The most common way to determine amplitude and frequency is to apply a Hilbert transform on each stage output. But an extra computation step is required for calculating the Hilbert transform in real-valued filter banks, and is computationally expensive.

Therefore, there is a need for systems and methods for analyzing and reconstructing an audio signal that is computationally less expensive than existing systems, while providing low end-to-end latency, and the necessary degrees of freedom for time-frequency resolution.

SUMMARY OF THE INVENTION

Embodiments of the present invention provide systems and methods for audio signal processing. In exemplary embodiments, a filter cascade of complex-valued filters is used to decompose an input audio signal into a plurality of sub-band signals. In one embodiment, an input signal is filtered with a complex-valued filter of the filter cascade to produce a first filtered signal. The first filtered signal is subtracted from the input signal to derive a first sub-band signal. Next, the first filtered signal is processed by a next complex-valued filter of the filter cascade to produce a next filtered signal. The processes repeat until the last complex-valued filters in the cascade has been utilized. In some embodiments, the complex-valued filters are single pole, complex-valued filters.

Once the input signal is decomposed, the sub-band signals may be processed by a reconstruction module. The reconstruction module is configured to perform a phase alignment on one or more of the sub-band signals. The reconstruction module may also be configured to perform amplitude compensation on one or more of the sub-band signals. Further, a time delay may be performed on one or more of the sub-band signals by the reconstruction module. Real portions of the compensated and/or time delayed sub-band signals are summed to generate a reconstructed audio signal.

DETAILED DESCRIPTION OF EXEMPLARY EMBODIMENTS

Embodiments of the present invention provide systems and methods for near perfect reconstruction of an audio signal. The exemplary system utilizes a recursive filter bank to generate quadrature outputs. In exemplary embodiments, the filter bank comprises a plurality of complex-valued filters. In further embodiments, the filter bank comprises a plurality of single pole, complex-valued filters.

Figure 1:
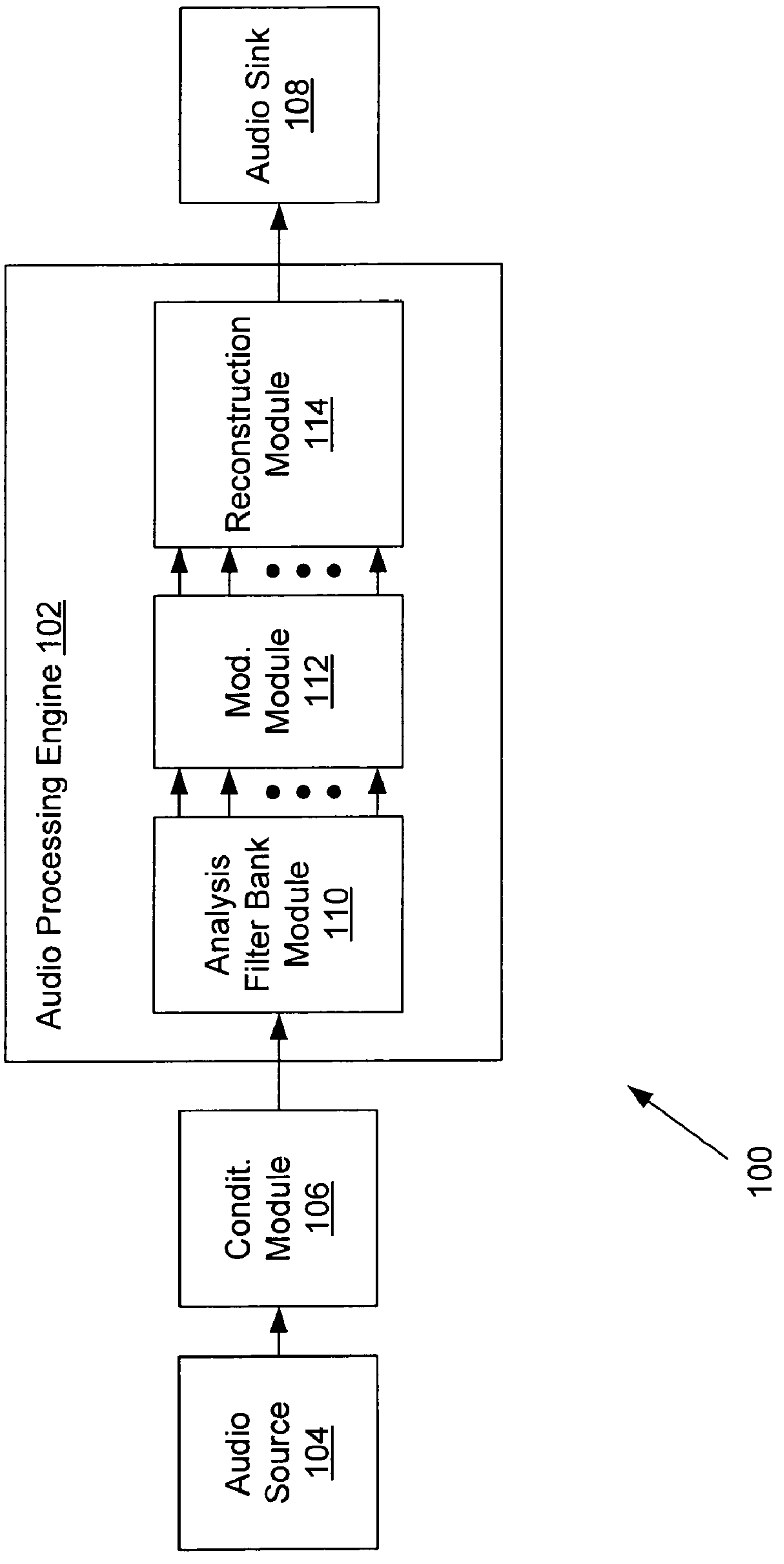
FIG. 1 is an exemplary block diagram of a system employing embodiments of the present invention.

Referring to FIG. 1, an exemplary system 100 in which embodiments of the present invention may be practiced is shown. The system 100 may be any device, such as, but not limited to, a cellular phone, hearing aid, speakerphone, telephone, computer, or any other device capable of processing audio signals. The system 100 may also represent an audio path of any of these devices.

The system 100 comprises an audio processing engine 102, an audio source 104, a conditioning module 106, and an audio sink 108. Further components not related to reconstruction of the audio signal may be provided in the system 100. Additionally, while the system 100 describes a logical progression of data from each component of FIG. 1 to the next, alternative embodiments may comprise the various components of the system 100 coupled via one or more buses or other elements.

The exemplary audio processing engine 102 processes the input (audio) signals inputted via the audio source 104. In one embodiment, the audio processing engine 102 comprises software stored on a device which is operated upon by a general processor. The audio processing engine 102, in various embodiments, comprises an analysis filter bank module 110, a modification module 112, and a reconstruction module 114. It should be noted that more, less, or functionally equivalent modules may be provided in the audio processing engine 102. For example, one or more the modules 110-114 may be combined into few modules and still provide the same functionality.

The audio source 104 comprises any device which receives input (audio) signals. In some embodiments, the audio source 104 is configured to receive analog audio signals. In one example, the audio source 104 is a microphone coupled to an analog-to-digital (A/D) converter. The microphone is configured to receive analog audio signals while the A/D converter samples the analog audio signals to convert the analog audio signals into digital audio signals suitable for further processing. In other examples, the audio source 104 is configured to receive analog audio signals while the conditioning module 106 comprises the A/D converter. In alternative embodiments, the audio source 104 is configured to receive digital audio signals. For example, the audio source 104 is a disk device capable of reading audio signal data stored on a hard disk or other forms of media. Further embodiments may utilize other forms of audio signal sensing/capturing devices.

The conditioning module 106 pre-processes the input signal (i.e., any processing that does not require decomposition of the input signal). In one embodiment, the conditioning module 106 comprises an auto-gain control. The conditioning module 106 may also perform error correction and noise filtering. The conditioning module 106 may comprise other components and functions for pre-processing the audio signal.

The analysis filter bank module 110 decomposes the received input signal into a plurality of sub-band signals. In some embodiments, the outputs from the analysis filter bank module 110 can be used directly (e.g., for a visual display.) The analysis filter bank module 110 will be discussed in more detail in connection with FIG. 2. In exemplary embodiments, each sub-band signal represents a frequency component.

The exemplary modification module 112 receives each of the sub-band signals over respective analysis paths from the analysis filter bank module 110. The modification module 112 can modify/adjust the sub-band signals based on the respective analysis paths. In one example, the modification module 112 filters noise from sub-band signals received over specific analysis paths. In another example, a sub-band signal received from specific analysis paths may be attenuated, suppressed, or passed through a further filter to eliminate objectionable portions of the sub-band signal.

The reconstruction module 114 reconstructs the modified sub-band signals into a reconstructed audio signal for output. In exemplary embodiments, the reconstruction module 114 performs phase alignment on the complex sub-band signals, performs amplitude compensation, cancels the complex portion, and delays remaining real portions of the sub-band signals during reconstruction in order to improve resolution of the reconstructed audio signal. The reconstruction module 114 will be discussed in more details in connection with FIG. 6.

The audio sink 108 comprises any device for outputting the reconstructed audio signal. In some embodiments, the audio sink 108 outputs an analog reconstructed audio signal. For example, the audio sink 108 may comprise a digital-to-analog (D/A) converter and a speaker. In this example, the D/A converter is configured to receive and convert the reconstructed audio signal from the audio processing engine 102 into the analog reconstructed audio signal. The speaker can then receive and output the analog reconstructed audio signal. The audio sink 108 can comprise any analog output device including, but not limited to, headphones, ear buds, or a hearing aid. Alternately, the audio sink 108 comprises the D/A converter and an audio output port configured to be coupled to external audio devices (e.g., speakers, headphones, ear buds, hearing aid.)

In alternative embodiments, the audio sink 108 outputs a digital reconstructed audio signal. In another example, the audio sink 108 is a disk device, wherein the reconstructed audio signal may be stored onto a hard disk or other medium. In alternate embodiments, the audio sink 108 is optional and the audio processing engine 102 produces the reconstructed audio signal for further processing (not depicted in FIG. 1).

Figure 2:
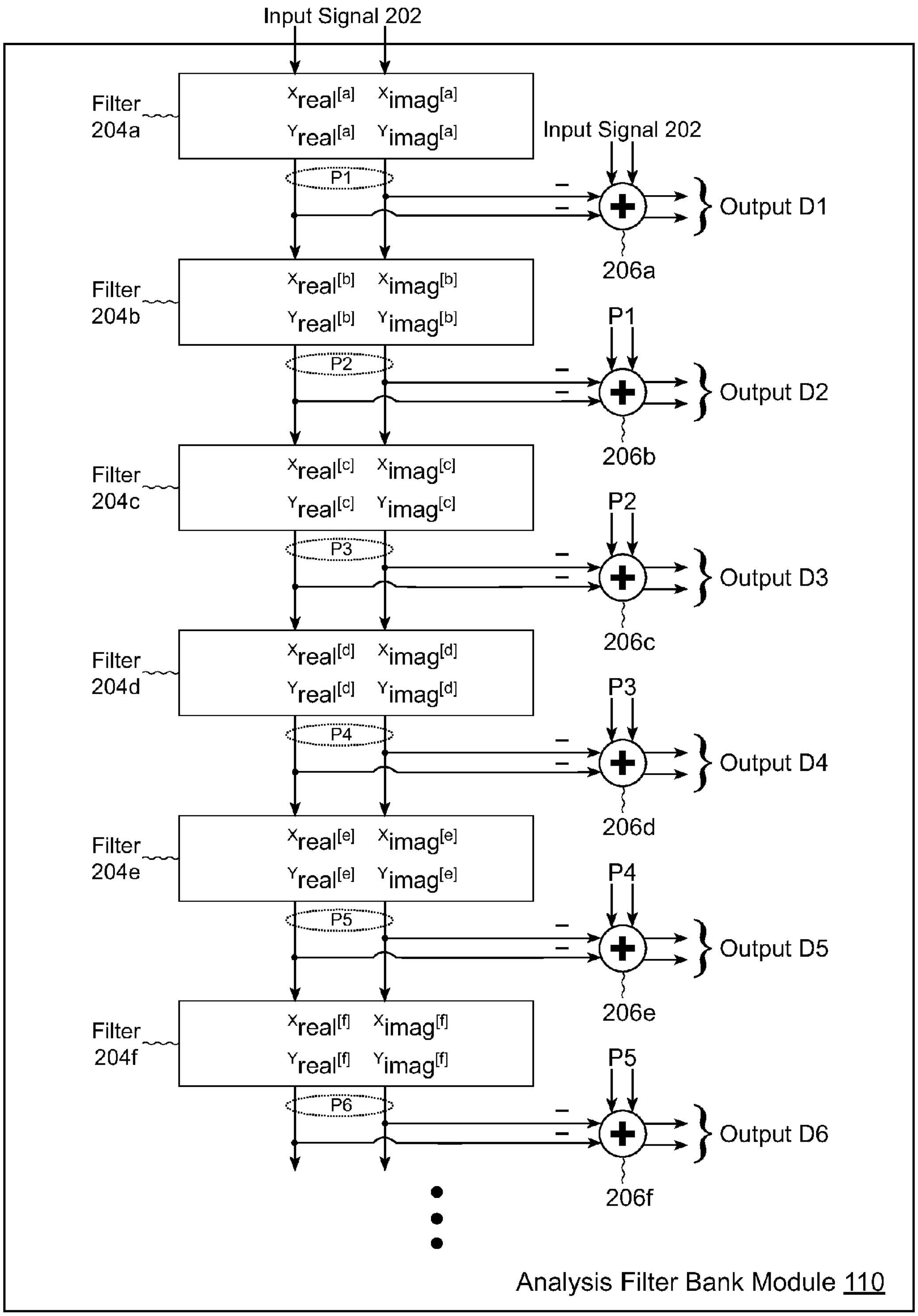
FIG. 2 is an exemplary block diagram of the analysis filter bank module in an exemplary embodiment of the present invention.

Referring now to FIG. 2, the exemplary analysis filter bank module 110 is shown in more detail. In exemplary embodiments, the analysis filter bank module 110 receives an input signal 202, and processes the input signal 202 through a series of filters 204 to produce a plurality of sub-band signals or components (e.g., P1-P6). Any number of filters 204 may comprise the analysis filter bank module 110. In exemplary embodiments, the filters 204 are complex valued filters. In further embodiments, the filters 204 are first order filters (e.g., single pole, complex valued). The filters 204 are further discussed in FIG. 3.

In exemplary embodiments, the filters 204 are organized into a filter cascade whereby an output of one filter 204 becomes an input in a next filter 204 in the cascade. Thus, the input signal 202 is fed to a first filter 204*a*. An output signal P1, of the first filter 204*a* is subtracted from the input signal 202 by a first computation node 206*a* to produce an output D1. The output D1 represents the difference signal between the signal going into the first filter 204*a* and the signal after the first filter 204*a*.

In alternative embodiments, benefits of the filter cascade may be realized without the use of the computation node 206 to determine sub-band signals. That is, the output of each filter 204 may be used directly to represent energy of the signal at the output or be displayed, for example.

Because of the cascade structure of the analysis filter bank module 110, the output signal, P1, is now an input signal into a next filter 204*b* in the cascade. Similar to the process associated with the first filter 204*a*, an output of the next filter 204*b* (i.e., P2) is subtracted from the input signal P1 by a next computation node 206*b* to obtain a next frequency band or channel (i.e., output D2). This next frequency channel emphasizes frequencies between cutoff frequencies of the present filter 204*b* and the previous filter 204*a*. This process continues through the remainder of the filters 204 of the cascade.

In one embodiment, sets of filters in the cascade are separated into octaves. Filter parameters and coefficients may then be shared among corresponding filters (in a similar position) in different octaves. This process is described in detail in U.S. patent application Ser. No. 09/534,682.

In some embodiments, the filters 204 are single pole, complex-valued filters. For example, the filters 204 may comprise first order digital or analog filters that operate with complex values. Collectively, the outputs of the filters 204 represent the sub-band components of the audio signal. Because of the computation node 206, each output represents a sub-band, and a sum of all outputs represents the entire input signal 202. Since the cascading filters 204 are first order, the computational expense may be much less than if the cascading filters 204 were second order or more. Further, each sub-band extracted from the audio signal can be easily modified by altering the first order filters 204. In other embodiments, the filters 204 are complex-valued filters and not necessarily single pole.

In further embodiments, the modification module 112 (FIG. 1) can process the outputs of the computation node 206 as necessary. For example, the modification module 112 may half wave rectify the filtered sub-bands. Further, the gain of the outputs can be adjusted to compress or expand a dynamic range. In some embodiments, the output of any filter 204 may be downsampled before being processed by another chain/cascade of filters 204.

In exemplary embodiments, the filters 204 are infinite impulse response (IIR) filters with cutoff frequencies designed to produce a desired channel resolution. The filters 204 may perform successive Hilbert transformations with a variety of coefficients upon the complex audio signal in order to suppress or output signals within specific sub-bands.

Figure 3:
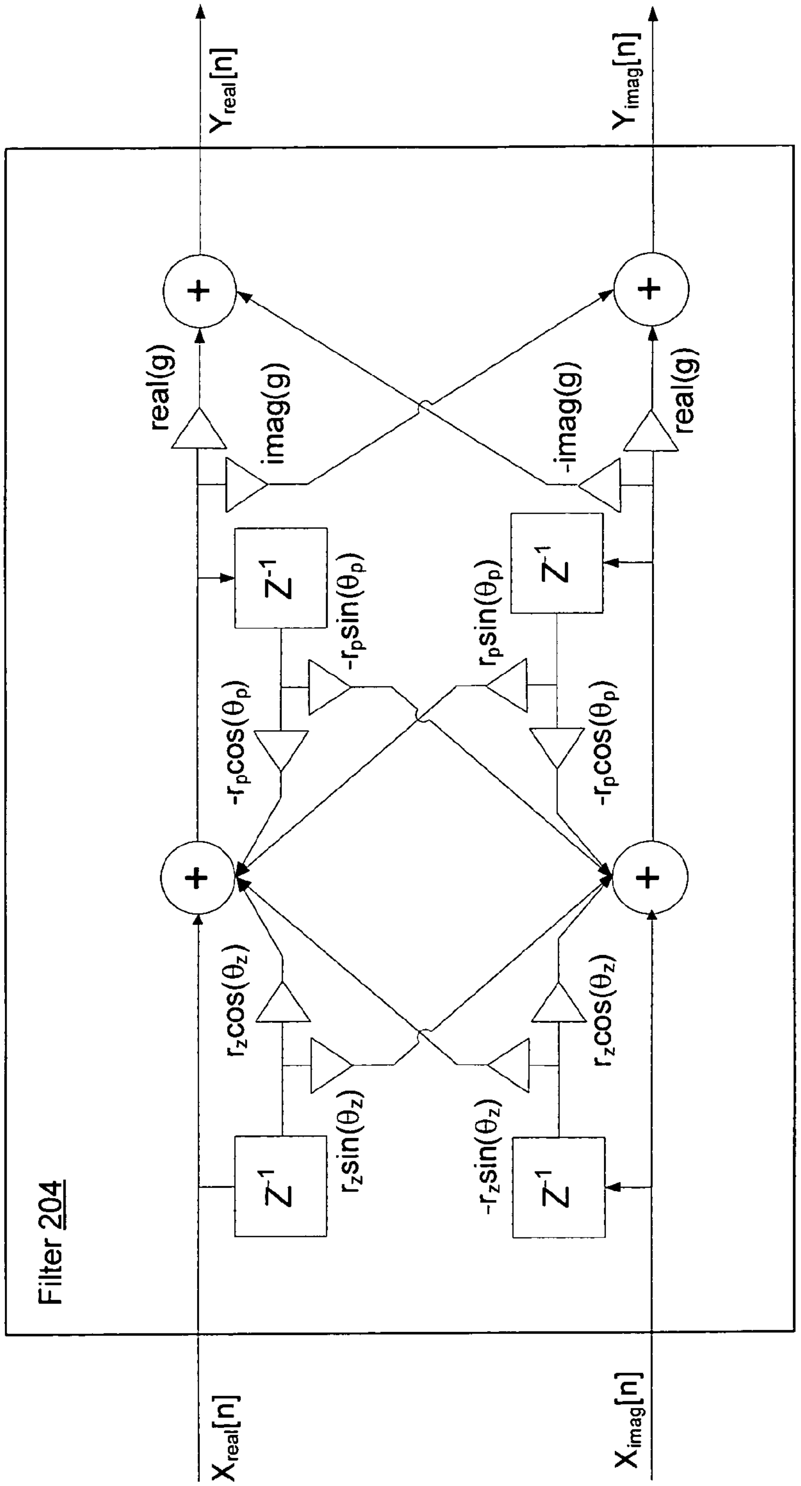
FIG. 3 is illustrates a filter of the analysis filter bank module, according to one embodiment.

FIG. 3 is a block diagram illustrating this signal flow in one exemplary embodiment of the present invention. The output of the filter 204, $y_{real}[n]$ and $y_{imag}[n]$ is passed as an input $x_{real}[n+1]$ and $x_{imag}[n+1]$, respectively, of a next filter 204 in the cascade. The term "n" identifies the sub-band to be extracted from the audio signal, where "n" is assumed to be an integer. Since the IIR filter 204 is recursive, the output of the filter can change based on previous outputs. The imaginary components of the input signal (e.g., $x_{imag}[n]$) can be summed after, before, or during the summation of the real components of the signal. In one embodiment, the filter 204 can be described by the complex first order difference equation y(k)=g*(x(k)+b*x(k−1))+a*y(k−1) where b=r_z*exp(i*theta_p) and a=−r_p*exp(i*theta_p) and "y" is a sample index.

In the present embodiment, "g" is a gain factor. It should be noted that the gain factor can be applied anywhere that does not affect the pole and zero locations. In alternative embodiments, the gain may be applied by the modification module 112 (FIG. 1) after the audio signals have been decomposed into sub-band signals.

Figure 4:
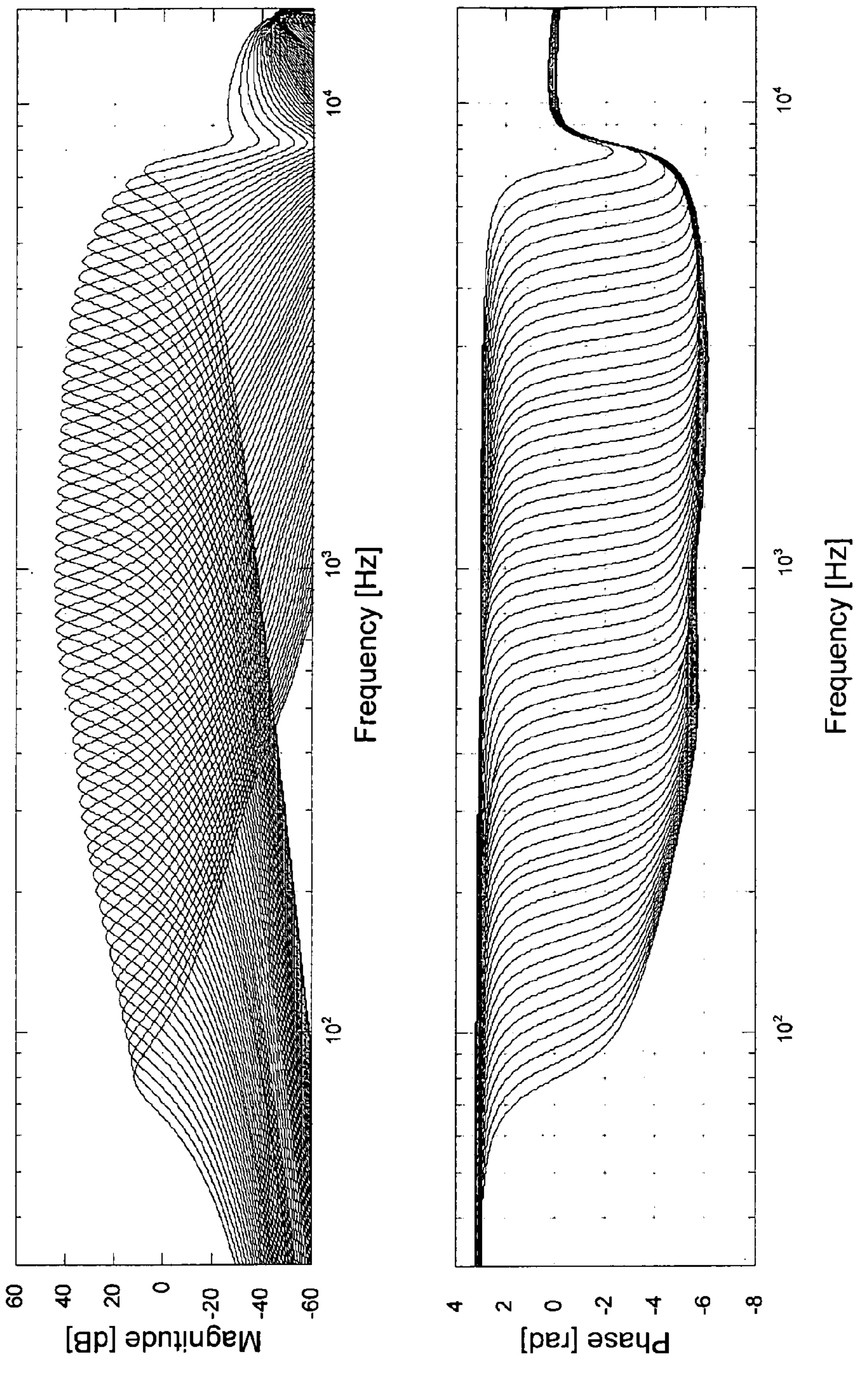
FIG. 4 illustrates for every six (6) sub-bands a log display of magnitude and phase of the sub-band transfer function.

Referring now to FIG. 4, an example log display of magnitude and phase for every six (6) sub-bands of an audio signal is shown. The magnitude and phase information is based on outputs from the analysis filter bank module 110 (FIG. 1). That is, the amplitudes shown in FIG. 4 are the outputs (i.e., output D1-D6) from the computation node 206 (FIG. 2). In the present example, the analysis filter bank module 110 is operating at a 16 kHz sampling rate with 235 sub-bands for a frequency range from 80 Hz to 8 kHz. End-to-end latency of this analysis filter bank module 110 is 17.3 ms.

In some embodiments, it is desirable to have a wide frequency response at high frequencies and a narrow frequency response at low frequencies. Because embodiments of the present invention are adaptable to many audio sources 104 (FIG. 1), different bandwidths at different frequencies may be used. Thus, fast responses with wide bandwidths at high frequencies and slow response with a narrow, short bandwidth at low frequencies may be obtained. This results in responses that are much more adapted to the human ear with relatively low latency (e.g., 12 ms).

Figure 5:
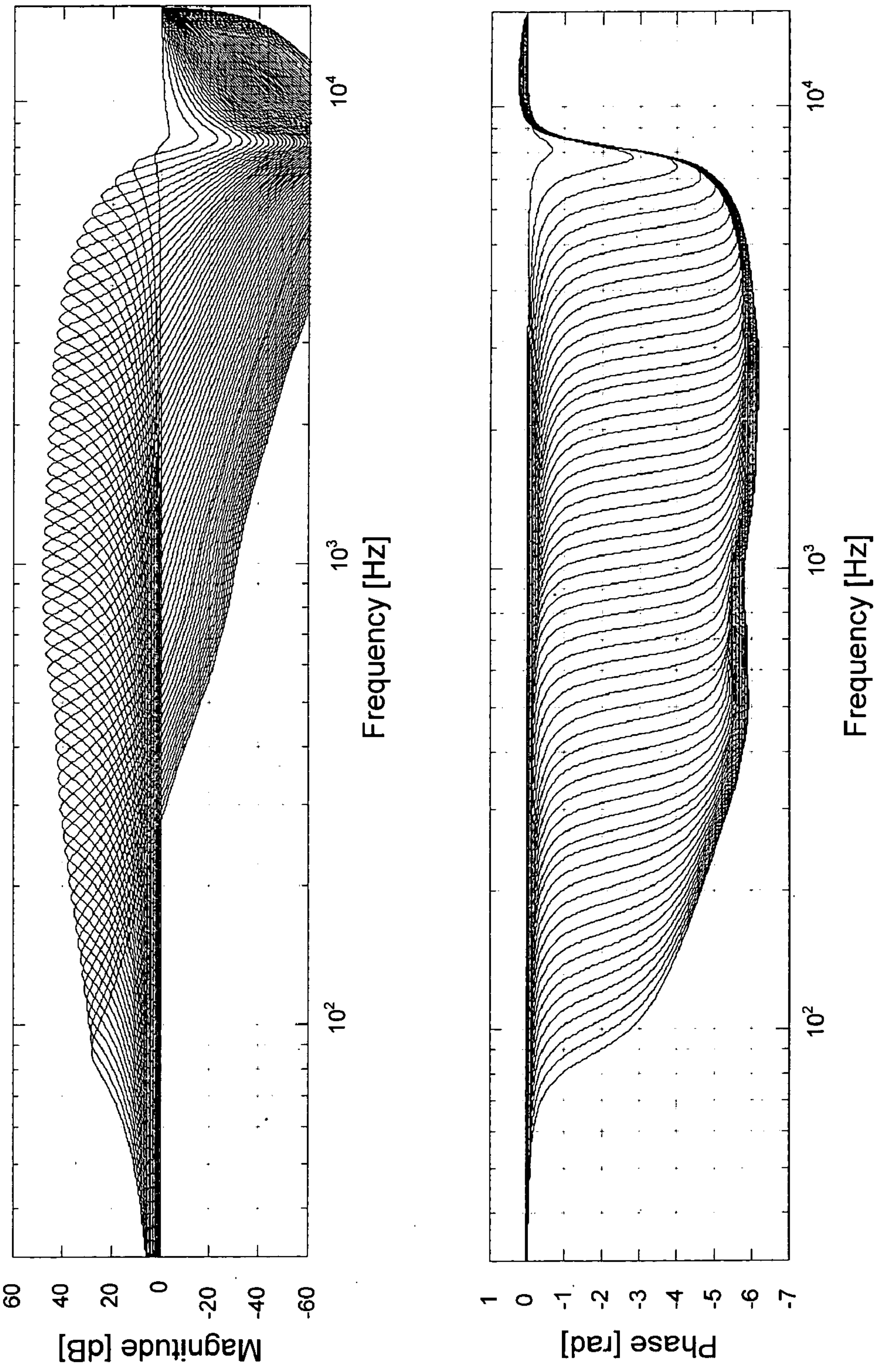
FIG. 5 illustrates for every six (6) stages a log display of magnitude and phase of the accumulated filter transfer functions.

Referring now to FIG. 5, an example of magnitude and phase per stage of an analytic cochlea design is shown. The amplitude shown in FIG. 5 is the outputs of filters 204 of FIG. 2 (e.g., P1-P6).

Figure 6:
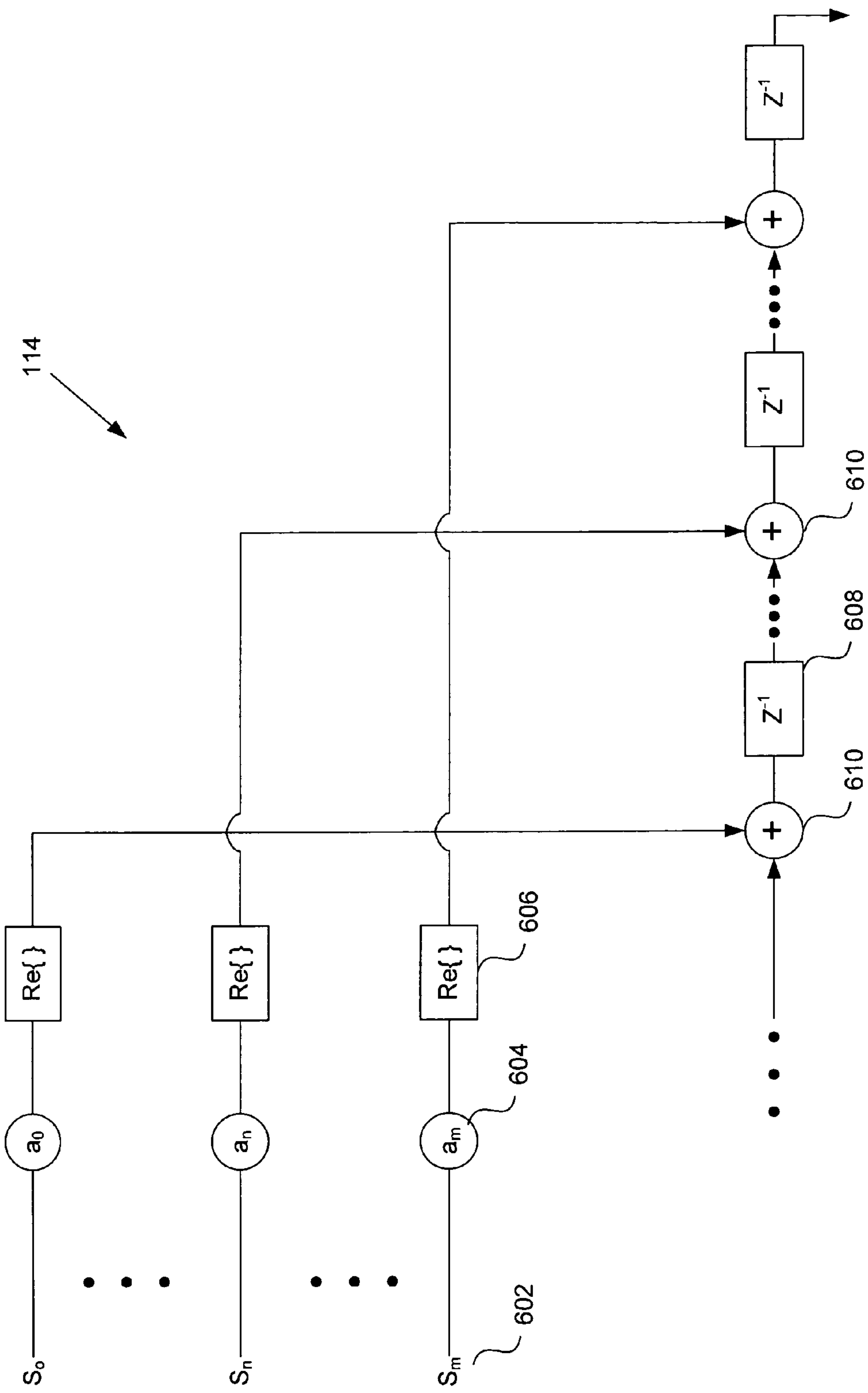
FIG. 6 illustrates the operation of the exemplary reconstruction module.

FIG. 6 illustrates operation of the reconstruction module 114 according to one embodiment of the present invention. In exemplary embodiments, the phase of each sub-band signal is aligned, amplitude compensation is performed, the complex portion of each sub-band signal is removed, and then time is aligned by delaying each sub-band signal as necessary to achieve a flat reconstruction spectrum and reduce impulse response dispersion.

Because the filters use complex signals (e.g., real and imaginary parts), phase may be derived for any sample. Additionally, amplitude may also be calculated by $A=\sqrt{((y_{real}[n])^2+(y_{imag}[n])^2)}$. Thus, the reconstruction of the audio signal is mathematically made easier. As a result of this approach, the amplitude and phase for any sample is readily available for further processing (i.e., to the modification module 112 (FIG. 1).

Since the impulse responses of the sub-band signals may have varying group delays, merely summing up the outputs of the analysis filter bank module 110 (FIG. 1) may not provide an accurate reconstruction of the audio signal. Consequently, the output of a sub-band can be delayed by the sub-band's impulse response peak time so that all sub-band filters have their impulse response envelope maximum at a same instance in time.

In an embodiment where the impulse response waveform maximum is later in time than the desired group delay, the filter output is multiplied with a complex constant such that the real part of the impulse response has a local maximum at the desired group delay.

As shown, sub-band signals 602 (e.g., $S_0$, $S_n$, and $S_m$) are received by the reconstruction module 114 from the modification module 112 (FIG. 1). Coefficients 604 (e.g., $a_0$, $a_n$, and $a_m$) are then applied to the sub-band signal. The coefficient comprises a fixed, complex factor (i.e., comprising a real and imaginary portion). Alternately, the coefficients 604 can be applied to the sub-band signal within the analysis filter bank module 110. The application of the coefficient to each sub-band signal aligns the phases of the sub-band signal and compensates each amplitude. In exemplary embodiments, the coefficients are predetermined. After the application of the coefficient, the imaginary portion is discarded by a real value module 606 (i.e., Re{ }).

Each real portion of the sub-band signal is then delayed by a delay $Z^{-1}$ 608. This delay allows for cross sub-band alignment. In one embodiment, the delay $Z^{-1}$ 608 provides a one tap delay. After the delay, the respective sub-band signal is summed in a summation node 610, resulting in a value. The partially reconstructed signal is then carried into a next summation node 610 and applied to a next delayed sub-band signal. The process continues until all sub-band signals are summed resulting in a reconstructed audio signal. The reconstructed audio signal is then suitable for the audio sink 108

(FIG. 1). Although the delays $Z^{-1}$ 608 are depicted after sub-band signals are summed, the order of operations of the reconstruction module 114 can be interchangeable.

Figure 7:
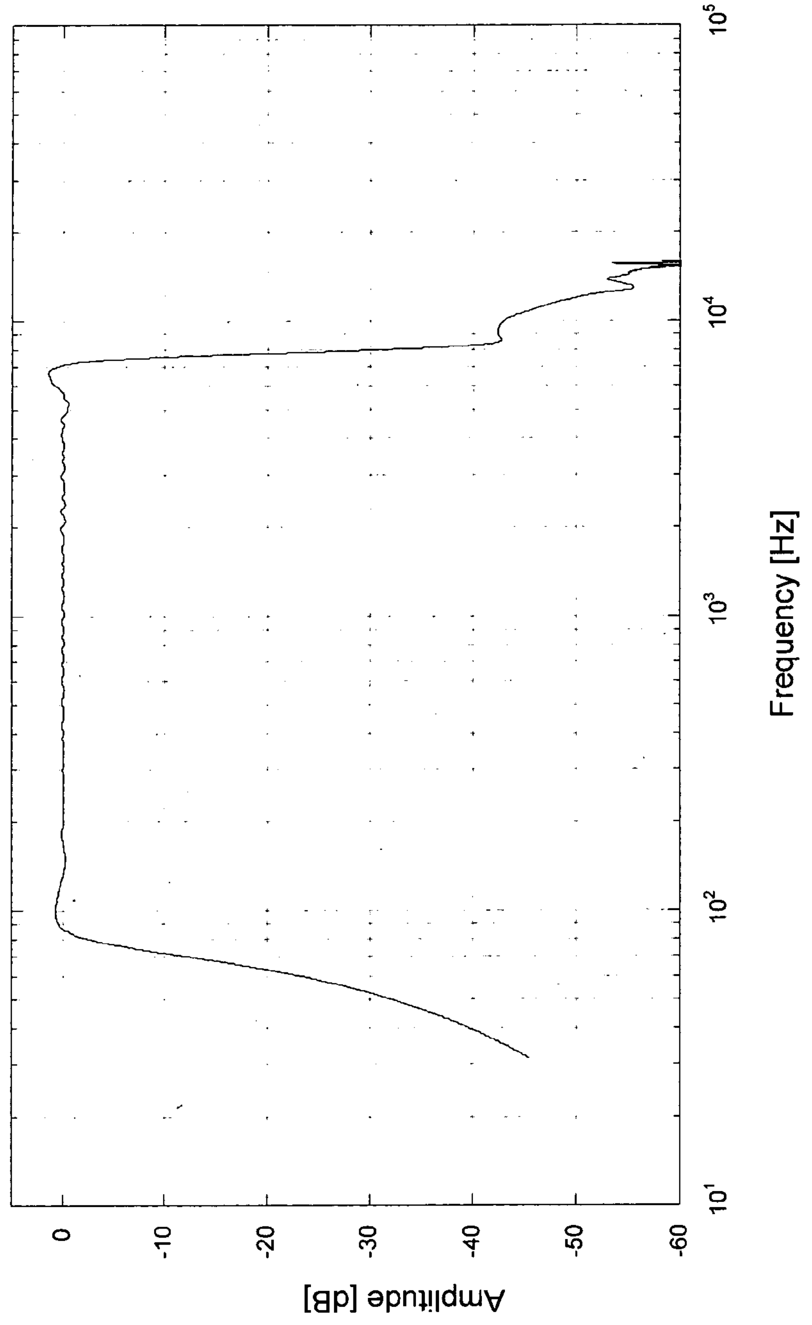
FIG. 7 illustrates a graphical representation of an exemplary reconstruction of the audio signal.

FIG. 7 illustrates a reconstruction graph based on the example of FIG. 4 and FIG. 5. The reconstruction (i.e., reconstructed audio signal) is obtained by combining the outputs of each filter 206 (FIG. 2) after phase alignment, amplitude compensation, and delay for cross sub-band alignment by the reconstruction module 114 (FIG. 1). As a result, the reconstruction graph is relatively flat.

Figure 8:
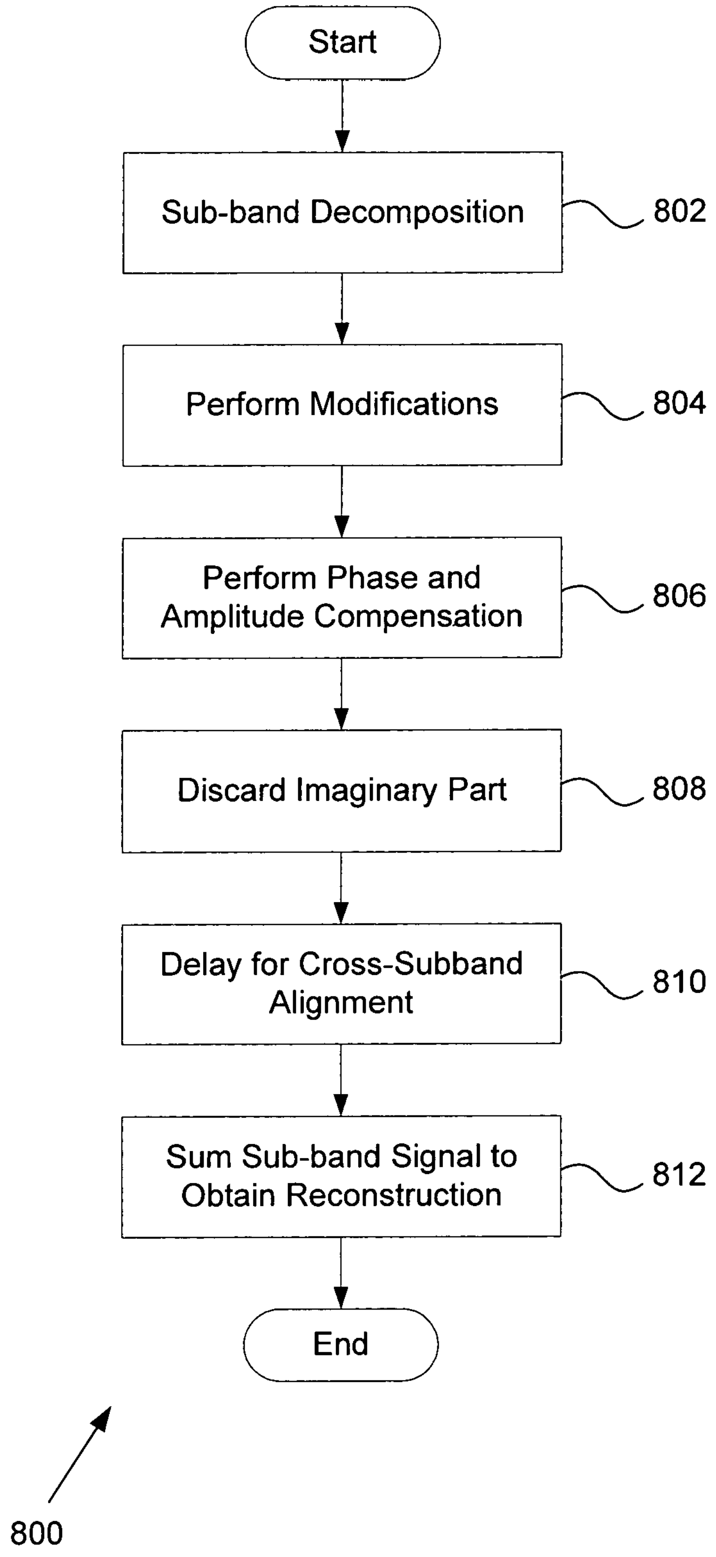
FIG. 8 is a flowchart of an exemplary method for reconstructing an audio signal.

Referring now to FIG. 8, a flowchart 800 of an exemplary method for audio signal processing is provided. In step 802, an audio signal is decomposed into sub-band signals. In exemplary embodiments, the audio signal is processed by the analysis filter bank module 110 (FIG. 1). The processing comprises filtering the audio signal through a cascade of filters 204 (FIG. 2), the output of each filter 204 resulting in a sub-band signal at the respective outputs 206. In one embodiment, the filters 204 are complex-valued filters. In a further embodiment, the filters 204 are single pole, complex-valued filters.

After sub-band decomposition, the sub-band signals are processed through the modification module 112 (FIG. 1) in step 804. In exemplary embodiments, the modification module 112 (FIG. 1) adjusts the gain of the outputs to compress or expand a dynamic range. In some embodiments, the modification module 112 may suppress objectionable sub-band signals.

A reconstruction module 114 (FIG. 1) then performs phase and amplitude compensation on each sub-band signal in step 806. In one embodiment, the phase and amplitude compensation occurs by applying a complex coefficient to the sub-band signal. The imaginary portion of the compensated sub-band signal is then discarded in step 808. In other embodiments, the imaginary portion of the compensated sub-band signal is retained.

Using the real portion of the compensated sub-band signal, the sub-band signal is delayed for cross-sub-band alignment in step 810. In one embodiment, the delay is obtained by utilizing a delay line in the reconstruction module 114.

In step 812, the delayed sub-band signals are summed to obtain a reconstructed signal. In exemplary embodiments, each sub-band signal/segment represents a frequency.

Embodiments of the present invention have been described above with reference to exemplary embodiments. It will be apparent to those skilled in the art that various modifications may be made and other embodiments can be used without departing from the broader scope of the invention. Therefore, these and other variations upon the exemplary embodiments are intended to be covered by the present invention.

What is claimed is:

1. A method for processing audio signals, the method comprising:
- filtering an input signal with a complex-valued filter of a filter cascade to produce a first filtered signal, the complex-valued filter being configured to operate on complex-valued inputs;
- filtering the first filtered signal with a second complex-valued filter of the filter cascade to produce a second filtered signal;
- performing phase alignment on one or more of the filtered signals using a complex multiplier; and
- summing the phase-aligned filtered signals to produce a reconstructed output signal.

2. The method of claim 1 wherein the complex-valued filters each contain a single pole.

3. The method of claim 1 further comprising:
- subtracting the first filtered signal from the input signal to derive a first sub-band signal;
- subtracting the second filtered signal from the first filtered signal to derive a second sub-band signal;
- performing phase alignment on one or more of the sub-band signals using a complex multiplier; and
- summing the phase-aligned sub-band signals to produce a reconstructed output signal.

4. The method of claim 3 further comprising disposing of an imaginary portion of one or more of the phase aligned sub-band signals.

5. The method of claim 3 further comprising performing amplitude compensation on one or more of the sub-band signals.

6. The method of claim 3 further comprising performing a time delay on one or more of the sub-band signals for cross-sub-band alignment.

7. The method of claim 6 further comprising modifying one or more of the filtered signals.

8. The method of claim 3 further comprising pre-processing the input signal prior to filtering the input signal with the complex-valued filter of the filter cascade.

9. The method of claim 3 further comprising modifying one or more of the sub-band signals.

10. The method of claim 3 wherein the sub-band signals are frequency components of the input signal.

11. A system for processing an audio signal, the system comprising:
- a memory; and
- a processor executing instructions stored in the memory for:
  - filtering an input signal with a complex-valued filter of a filter cascade to produce a first filtered signal, the complex-valued filter configured to operate on complex-valued inputs;
  - filtering the first filtered signal with a second complex-valued filter of the filter cascade to produce a second filtered signal;
  - performing phase alignment on one or more of the filtered signals using a complex multiplier; and
  - summing the phase-aligned filtered signals to produce a reconstructed output signal.

12. The system of claim 11 wherein the complex-valued filters each contain a single pole.

13. The system of claim 11 wherein the processor further executes instructions for performing:
- subtracting the first filtered signal from the input signal to derive a first sub-band signal;
- subtracting the second filtered signal from the first filtered signal to derive a second sub-band signal;
- performing phase alignment on one or more of the sub-band signals using a complex multiplier; and
- summing the phase-aligned sub-band signals to produce a reconstructed output signal.

14. The system of claim 13 wherein the processor further executes instructions for performing amplitude compensation on one or more of the sub-band signals.

15. The system of claim 13 wherein the processor further executes instructions for performing a time delay on one or more of the sub-band signals.

16. The system of claim 13 wherein the processor further executes instructions for modifying one or more of the sub-band signals based on an analysis path from the filter cascade.

17. The system of claim 11 the processor further executes instructions for pre-processing the input signal prior to filtering the input signal with the filter cascade.

18. A machine-readable medium having embodied thereon a program, the program being executable by a machine to perform a method for processing an audio signal, the method comprising:
- filtering an input signal with a complex-valued filter of a filter cascade to produce a first filtered signal, the complex-valued filter being configured to operate on complex-valued inputs;
- filtering the first filtered signal with a second complex-valued filter of the filter cascade to produce a second filtered signal;
- performing phase alignment on one or more of the filtered signals using a complex multiplier; and
- summing the phase-aligned filtered signals to produce a constructed output signal.

19. The machine-readable medium of claim 18 wherein the complex-valued filter and the second complex-valued filter each contain a single pole.

20. The machine-readable medium of claim 18 wherein the method further comprises:
- subtracting the first filtered signal from the input signal to derive a first sub-band signal;
- subtracting the next filtered signal from the first filtered signal to derive a second sub-band signal;
- performing phase alignment on one or more of the sub-band signals using a complex multiplier; and
- summing the phase-aligned sub-band signals to produce a reconstructed output signal.

21. The machine-readable medium of claim 20 wherein the method further comprises performing amplitude compensation on one or more of the sub-band signals.

22. The machine-readable medium of claim 20 wherein the method further comprises performing a time delay on one or more the sub-band signals.

23. The machine-readable medium of claim 20 wherein the method further comprises pre-processing the input signal prior to filtering the input signal with the filter cascade.

* * * * *